United States Patent [19]
Ramey et al.

[11] Patent Number: 5,476,387
[45] Date of Patent: Dec. 19, 1995

[54] MEMORY CARD FRAME AND COVER KIT

[75] Inventors: Samuel C. Ramey, Chicago; Steven Hiller, Elk Grove Village; Joseph Ufheil, Chicago, all of Ill.

[73] Assignee: Methode Electronics Inc., Chicago, Ill.

[21] Appl. No.: 73,163

[22] Filed: Jun. 7, 1993

[51] Int. Cl.$^6$ .................................................. H05K 5/00
[52] U.S. Cl. ...................... 439/76.1; 235/492; 361/737
[58] Field of Search .......................... 439/76, 78, 79, 439/73, 59, 62, 64, 142, 188, 352; 361/737; 235/492

[56] References Cited

U.S. PATENT DOCUMENTS

| | | | |
|---|---|---|---|
| 3,140,907 | 7/1964 | Davies . | |
| 4,807,955 | 5/1989 | Ashman et al. | 350/96.20 |
| 4,826,447 | 5/1989 | Forker et al. | 439/328 |
| 4,890,197 | 12/1989 | Banjo et al. | 361/392 |
| 4,893,001 | 1/1990 | Ohkubo et al. | 235/490 |
| 4,924,076 | 5/1990 | Kitamura | 235/492 |
| 4,931,991 | 6/1990 | Cvijanovich | 365/52 |
| 4,952,161 | 8/1990 | Komatsu | 439/155 |
| 5,014,160 | 5/1991 | McCoy, Jr. | 361/424 |
| 5,038,250 | 8/1991 | Uenaka et al. | 235/492 X |
| 5,053,613 | 10/1991 | Onoda | 361/737 X |
| 5,061,845 | 10/1991 | Pinnavaia | 235/492 |
| 5,157,244 | 10/1992 | Mroczkowski et al. | 235/441 |
| 5,173,840 | 12/1992 | Kodai et al. | 235/492 X |
| 5,189,638 | 2/1993 | Kimura | 235/492 X |
| 5,207,586 | 5/1993 | MacGregor et al. | 439/76 |
| 5,210,442 | 5/1993 | Ishimoto | 235/492 X |
| 5,242,310 | 9/1993 | Leung | 439/76 |
| 5,278,445 | 1/1994 | Kemura et al. | 235/492 X |
| 5,313,364 | 5/1994 | Omori et al. | 439/76 X |

FOREIGN PATENT DOCUMENTS

| | | |
|---|---|---|
| 0055017A1 | 6/1982 | European Pat. Off. . |
| 0452553A2 | 10/1991 | European Pat. Off. . |

*Primary Examiner*—Z. R. Bilinsky
*Attorney, Agent, or Firm*—David L. Newman

[57] ABSTRACT

A memory card comprises a metallic top cover, metallic bottom cover and frame housing a PC board and electrical connector. The top and bottom covers are joined by mechanical attachment to the frame and are grounded together by electro-mechanical connection and provide for grounding between the PC board and the covers. Mechanical latching mechanism provides for easy assembly of frame and covers by all vertical assembly. Integral spring tabs provide grounding of PC board and provide frictional pressure against PC board to provide stability of assembly.

9 Claims, 2 Drawing Sheets

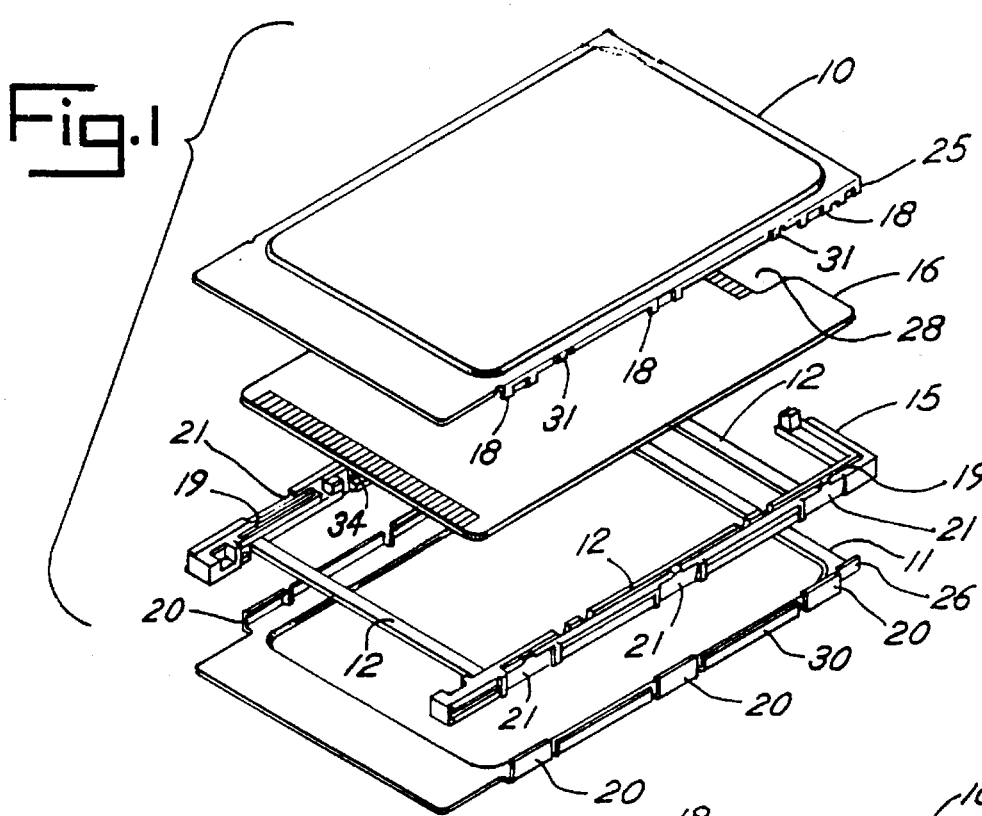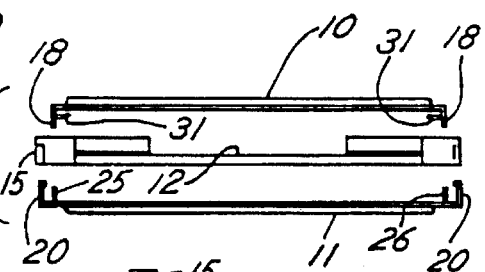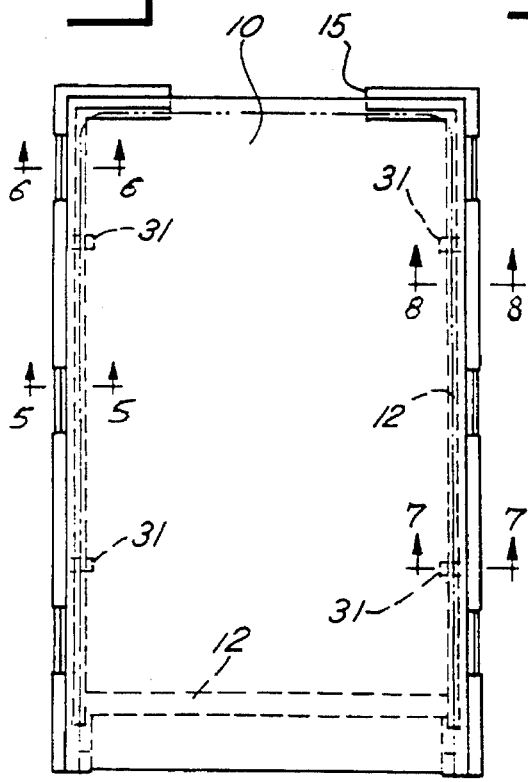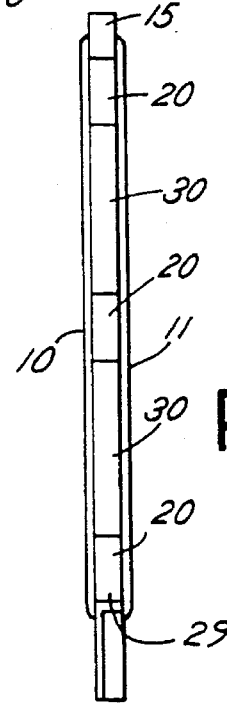

MEMORY CARD FRAME AND COVER KIT

BACKGROUND OF THE INVENTION

This invention pertains to integrated circuit memory cards and in particular, a memory card having an improved frame and cover.

IC cards and mating sockets of free insertion and withdrawal capability having the capabilities to store large amounts of information and enact logical and calculating functions and have been developed to comprise thin, card-like plastic and metallic outer package which house a frame and a semiconductor/integrated circuit device and an electrical connector for electrically connecting the semiconductor device to external equipment. Such devices will be referred to hereinafter as memory cards. The memory cards have found widespread use as storage devices for data and programs for video games and microcomputers. A conventional memory card has a plastic and metallic outer package consisting of an upper section and a lower section and a frame. The two sections package, surround and protect integrated circuit devices on a printed circuit (PC) board.

It has been known in the art to secure the two sections to one another by applying a viscous bonding agent to the connecting surfaces and pressing the surfaces of one package section against the connecting surface of the other package section. Connecting the top and bottom sections using adhesives is time consuming and can become problematic when the adhesive leaks or runs onto the PC board. It is important in these memory cards to provide a grounding means. Such grounding has been achieved by bonding tabs between the frame and the PC board. Such grounding is very expensive due to the assembly required in order to solder the PC board during manufacturing.

SUMMARY OF THE INVENTION

In order to solve the above problems, this invention includes an all-metallic top cover and bottom cover having integral ground clips, integral snap-locking means for vertical assembly, an integral PC board locking feature, grounding means between the top and bottom covers, integral grounding means between the covers and PC board and metallic sides for easy grounding at a variety of locations. The covers and frame include means for mechanical assembly and retention of PC board.

The housing includes a frame having supports for holding a printed circuit board; a top metallic cover having a means for mechanically securing the top cover to said frame; and a bottom metallic cover having a means for mechanically securing the bottom cover to the frame. The top and bottom covers have a means for electrically grounding to each other, including the top and bottom covers having fingers perpendicular to the covers protruding within the frame and the top and bottom fingers in abutting contact. A means for securing the top cover includes a tab which snap-fits within the frame or a tab which latches over the frame. Likewise, the bottom cover may be secured by having a tab which snap-fits within the frame or latches over the frame. The frame has included an integral rib protruding inwardly to hold said printed circuit board thereunder. The top or bottom cover have a spring tab protruding inwardly to hold the printed circuit board thereunder.

It is an object of the present invention to provide a frame and covers which may be assembled without the use of bonding or adhesives.

It is another object of the present invention to provide a frame and covers which may vertically assembled.

It is a further object of the present invention to provide a frame and covers having a built-in grounding clip so that no extra assembly is required.

It is another object of this invention to provide a memory card frame and cover which would eliminate possible compatibility problems.

DESCRIPTION OF THE DRAWINGS

There is shown in the drawings a presently preferred embodiment of the present invention, wherein like numerals in the various figures pertain to like elements, and wherein:

FIG. 1 is a perspective view of an exploded memory card assembly of this invention;

FIG. 2 is a top view of a memory card frame of this invention;

FIG. 3 is a side view of an assembled cover and frame of this invention;

FIG. 4 is an end view of an exploded frame and cover assembly of this invention;

DESCRIPTION OF THE PRESENT EMBODIMENTS

Figure 5:
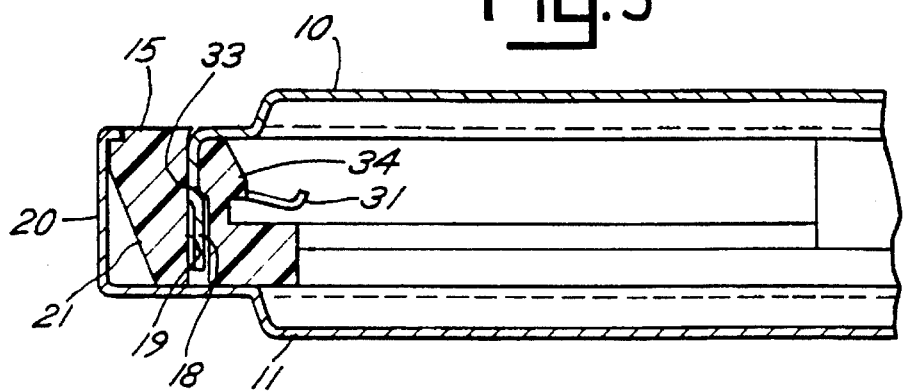
FIG. 5 is an enlarged longitudinal cross-sectional view of FIG. 2 of this invention taken at Section 5—5.

The present invention relates to an improved memory card frame and covers. The frame and covers are better understood by reference to FIGS. 1–8 which show various aspects of a preferred memory card assembly of this invention.

Turning to FIG. 1, top cover 10 and bottom cover 11 are assembled together on frame 15 which holds printed circuit board 16 on supports 12. The covers 10, 11 in a preferred embodiment are constructed of any metallic material such as stainless steel and are drawn in order to provide rigidity and strength in the construction of the covers. In the preferred embodiment, the covers 10, 11 are stepped having a protruding center region which provides further rigidity of the covers. The frame 15 in a preferred embodiment is constructed of any plastic material such as polycarbonate or any thermal plastic. The top cover 10 is secured to the frame 15 by snap tabs 18 which are inserted into snap grooves 19. The snap tabs 18 are located on each side of the top cover 10 and in the preferred embodiment there are three snap tabs 18 on each side of each top cover 10. The snap grooves 19 are correspondingly located to the snap tabs 18 and are likewise located on both sides of the frame 15 having in the preferred embodiment three snap grooves on each side of the frame 15, providing a total of six (6) snap tabs 18 and corresponding snap grooves 19.

The bottom cover 11 is attached to the frame 15 via latch tabs 20 which latch over the latch surfaces 21 of the frame 15. The latch surfaces 21 are angled inward from the top to the bottom of the frame 15 (see FIG. 5) so that latch tabs 20 easily slide up from the narrow bottom to the top of the latch surface 21 and latches over the top of frame 15. Such mechanical locking pairs of snap tabs 18 with snap grooves 19 and latch tabs 20 with latch surfaces 21 are oriented directly across from each other to provide vertical assembly to avoid twisting or bending of the covers and frame during assembly which may cause breakage or stretching. In a preferred embodiment, the frame and cover assembly includes six (6) points around the perimeter at which locking occurs to provide a total of twelve (12) locking points from top and bottom to provide the most secure and stable assembly. The locking points are across from each other on opposite sides of the memory card so that assembly may be accomplished by vertical pressure applied at one end of the memory card followed by vertical pressure applied at the other end of the memory card. Such assembly does not require any twisting or bending of the frame and covers which might occur if the locking points were at opposite corners.

Spring tabs 31 extend perpendicularly from top cover 10 and then bend at approximately a right angle (out of view) inwardly. Spring tabs both hold the PC board 16 and provide grounding between the top cover 10 and the PC board 16 by making contact with a grounding surface of the PC board 16. The spring tabs 31 in the preferred embodiment are located at four (4) locations on the top cover 10 for maximum grounding and securement of the PC board 16. The spring tabs 31 are located in the preferred embodiment only on the top cover 10 to provide stability in holding the PC board 16. Top finger 25 comes into abutting and electrical contact with bottom finger 26 when the covers 10, 11 are assembled onto frame 15. The PC board 16 has an I/O cut-out 28. The ends of the frame 15 are modular in the mold for interchangeability, allowing for the use of multiple I/O connectors. As well, although an I/O connector is optional and the memory card may be constructed without an I/O connector, the I/O connector of an alternative embodiment may also be molded directly as an integral part of the frame 15.

Turning to FIG. 2, the frame 15 has the top cover 10 and bottom cover (not shown) assembled thereon. Cross sections 7—7 and 8—8 are taken along the right side of the frame end cover assembly and cross sections 5—5 and 6—6 are taken along the left side of the frame end cover assembly. Spring tabs 31 extend inwardly from top cover 10 and in the preferred embodiment of this invention are located two on each side of the frame and cover assembly. Supports 12 provide a ledge area around frame 15 to support the PC board 16 when inserted onto the frame 15.

Turning to FIG. 3, the frame 15 is shown having the top cover 10 and bottom cover 11 attached thereto. The assembly of the frame and covers provides sides 29 being completely shrouded in metal for easy grounding at a variety of locations along the frame and cover assembly and eliminates possible grounding incompatibilities. The side 29 is completely shrouded by metallic latch tabs 20 extending from the bottom cover 11 and metallic side portions 30, also extend from the bottom cover 11.

Turning to FIG. 4, top cover 10 is shown having snap tabs 18 which are inserted into frame 15. Frame 15 holds a PC board on supports 12. Spring tabs 31 extend from snap tabs 18 and mechanically hold the PC board to provide a stable nonmoving PC board and act as grounding clips. Bottom cover 11 has latch tabs 20 and bottom fingers 26 which provide electrical contact with the top cover 10.

Turning to FIG. 5, an enlarged longitudinal cross-sectional view taken at Section BB of FIG. 2 is shown having top cover 10 inserted onto frame 15. The stepped portion of the protruding center region of top and bottom covers 10, 11 is shown. Snap tab 18 is inserted into snap groove 19 of frame 15. The snap tab 18 engages lip 33 of frame 15 to provide snapping engagement of the top cover 10 within the frame 15. Spring tab 31 protrudes from the frame 15 to hold a printed circuit board thereunder, providing stability and reduce vibration of PC board 16. The spring tab 31 also provides grounding of a PC board to the covers by spring tab 31 making electrical contact to a grounding surface of PC board 16. A printed circuit board may be held in place by rib 34 which is integrally connected to frame 15 to hold a printed circuit board 16 thereunder. PC board 16 is centered over frame 15 and vertically pushed past rib 34, forcing the rib 34 outward. Once the PC board 16 is pushed completely past the front surface of rib 34, the rib 34 snaps forward locking the PC board 16 thereunder. In the preferred embodiment, the frame 15 includes four (4) such ribs 34 located near the corners of the frame 15 for maximum stability of the PC board 16 within the assembled memory card. Bottom cover 11 is securely attached to the frame 15 by latch tabs 20 which latch over latch surfaces 21. In the preferred embodiment, latch surfaces 21 are angled so that latch tabs 20 easily slide over narrow portion at the bottom of the frame 15 and easily slide upward and outward, while the latch surface 21 broadens, until latch tab 20 latches over the frame 15 to secure bottom cover 11 in place on the frame 15.

Figure 6:
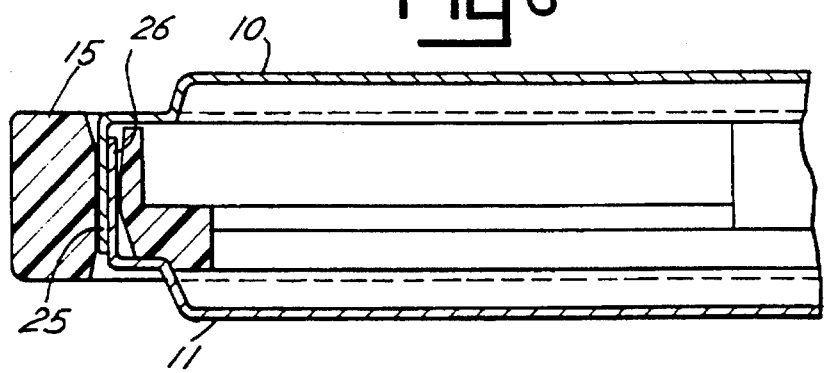
FIG. 6 is an enlarged longitudinal cross-sectional view of FIG. 2 of this invention taken at Section 6—6.

Turning to FIG. 6, an enlarged longitudinal cross-sectional view of FIG. 2 taken at Section 6—6 is shown. The top cover 10 is shown having top finger 25 inserted downward into frame 15. The bottom cover 11 has bottom finger 26 inserted into frame 15 and making electro-mechanical contact between the top finger 25 of top cover 10 and bottom cover 11. The covers by making electro-mechanical contact inside the frame 15, grounds the top and bottom covers 10, 11 together, allowing for grounding anywhere on the covers with the PC board.

Figure 7:
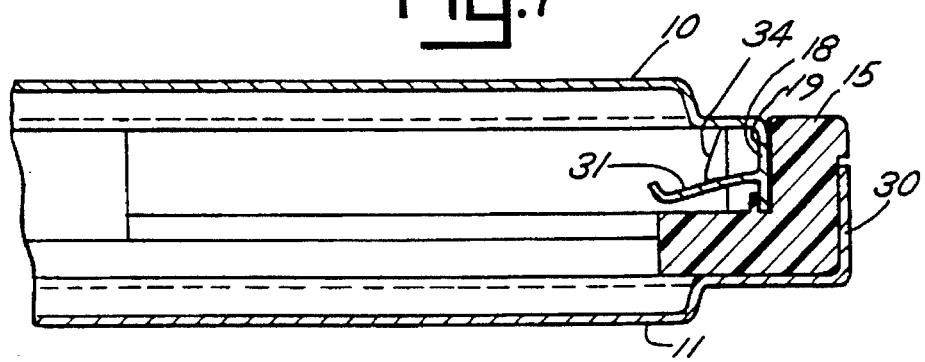
FIG. 7 is an enlarged longitudinal cross-sectional view of FIG. 2 of this invention taken at Section 7—7; and, FIG. 8 is an enlarged longitudinal cross-sectional view of FIG. 2 of this invention taken at Section 8—8.

Turning to FIG. 7, top cover 10 is shown having snap tab 18 projecting into snap groove 19 in frame 15. Spring tab 31 projects from snap tab 18 and provides grounding and mechanical stability by pressing down on the top of a PC board upon placement of the top cover 10 within the frame 15. Bottom cover 11 is shown having side portion 30 covering the side of frame 15.

Figure 8:
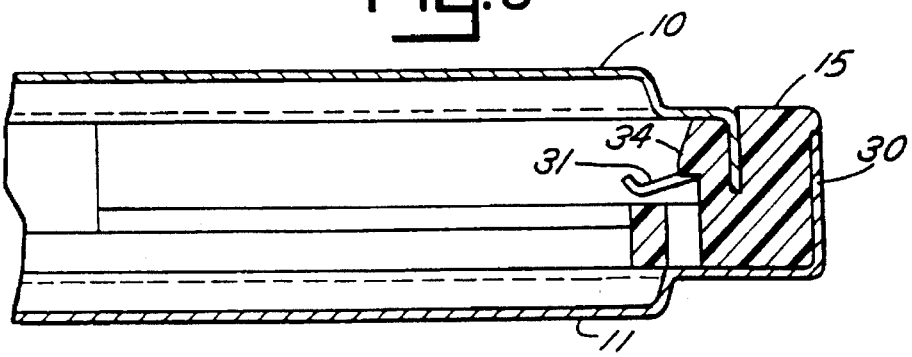

Turning to FIG. 8, top cover 10 is secured to frame 15. Spring tab 31 projects from top cover 10. Bottom cover 11 has side portion 30 to cover the side of frame 15. Rib 34 integral to frame 15 snaps down on a PC board to provide stability within the cover frame assembly.

The description above has been offered for illustrative purposes only, and it is not intended to limit the scope of the invention of this application which is defined in the following claims. For example, preferred embodiments have been discussed having specific numbers of ribs, tabs and latches in specific locations on the covers and frame. However, this invention may be modified to include other arrangements of ribs, tabs or latches without departing from the spirit or scope of the invention.

We claim:

1. A memory card housing for housing a semi-conductor device comprising:

a frame having supports for holding a printed circuit board;

a top metallic cover having a tab which snap-fits within said frame;

a bottom metallic cover having a means for mechanically securing said bottom cover to said frame;

said top cover having a top finger perpendicular to said top cover protruding within said frame;

said bottom cover having a bottom finger perpendicular to said bottom cover protruding within said frame; and said top and bottom fingers in abutting contact.

2. The memory card housing of claim 1, wherein said top cover and said bottom cover have a means for electrically grounding to each other.

3. The memory card housing of claim 1, wherein said means for securing said bottom cover includes said bottom cover having a tab which snap-fits within said frame.

4. The memory card housing of claim 1, wherein said means for securing said bottom cover includes said bottom cover having a tab which latches over said frame.

5. The memory card housing of claim 1, wherein said frame having an integral rib protruding inwardly to hold said printed circuit board thereunder.

6. The memory card housing of claim 1, wherein said top cover having a spring tab integrally attached to said top cover and protruding inwardly to hold said printed circuit board thereunder.

7. The memory card housing of claim 6, wherein said spring tab makes electrical contact with a printed circuit board to provide electrical grounding.

8. The memory card housing of claim 1, wherein said bottom cover having a spring tab integrally attached to said bottom cover and protruding inwardly to hold said printed circuit board thereunder.

9. The memory card housing of claim 8, wherein said spring tab makes electrical contact with a printed circuit board to provide electrical grounding.

* * * * *